United States Patent [19]

Stager et al.

[11] Patent Number: 5,372,673
[45] Date of Patent: Dec. 13, 1994

[54] METHOD FOR PROCESSING A LAYER OF MATERIAL WHILE USING INSITU MONITORING AND CONTROL

[75] Inventors: Charles W. Stager; Paul M. Winebarger; Gregory S. Ferguson; Christopher A. Turman, all of Austin, Tex.

[73] Assignee: Motorola, Inc., Schaumburg, Ill.

[21] Appl. No.: 8,034

[22] Filed: Jan. 25, 1993

[51] Int. Cl.⁵ .......................................... H01L 21/306
[52] U.S. Cl. ................................. 156/626; 156/627
[58] Field of Search .......................................... 156/626

[56] References Cited

U.S. PATENT DOCUMENTS

| | | | |
|---|---|---|---|
| 4,356,055 | 10/1982 | Montier | 156/626 |
| 4,457,820 | 7/1984 | Bergeron et al. | 204/192 E |
| 4,462,860 | 7/1984 | Szmanda | 156/626 |
| 4,496,425 | 1/1985 | Kuyel | 156/626 |
| 4,676,867 | 6/1987 | Elkins et al. | 156/643 |
| 4,676,868 | 6/1987 | Riley et al. | 156/643 |
| 4,680,084 | 7/1987 | Heimann et al. | 156/643 |
| 4,789,426 | 12/1988 | Pipkin | 156/643 |
| 4,808,259 | 2/1989 | Jillie, Jr. et al. | 156/643 |
| 4,861,419 | 8/1989 | Flinchbaugh et al. | 156/626 |
| 4,872,944 | 10/1989 | Rufin et al. | 156/626 |
| 5,002,631 | 3/1991 | Giapis et al. | 156/626 |
| 5,014,217 | 5/1991 | Savage | 364/498 |
| 5,021,662 | 6/1991 | Johnson | 250/339 |
| 5,200,023 | 4/1993 | Gifford et al. | 156/626 |
| 5,232,537 | 8/1993 | Yachi | 156/626 |

FOREIGN PATENT DOCUMENTS

| | | | |
|---|---|---|---|
| 159824 | 4/1983 | German Dem. Rep. | 156/626 |
| 211440 | 7/1984 | German Dem. Rep. | 156/626 |
| 113184 | 6/1984 | Japan | 156/626 |
| 76435 | 4/1988 | Japan | 156/626 |
| 158733 | 6/1989 | Japan | 156/626 |
| 2052339 | 1/1981 | United Kingdom | 156/626 |

OTHER PUBLICATIONS

S. Wolf, et al. Silicon Processing for the VLSI Era, vol. I: Process Technology, Lattice Press, Sunset Beach, Calif. (1986) pp. 565–567.

T. Bayer, et al. "Interferometric etch end–point detection for two–component materials" IBM Tech. Disc. Bull vol. 26, No. 2 (1983) pp. 688–689.

G. Hopf, et al., "Optical etch–point detection using chromatic aberration" IBM Tech. Disc. Bull. vol. 26, No. 6 (1983) pp. 2780–2781.

B. R. Soller et al. "Application of Emission Spectroscopy for Profile Control during Oxygen RIE of Thick Photoresist" J. Electrochem. Soc. (Jun. 1984) pp. 1353–1356.

"Advanced Multiple–Step Resist Etchback Planarization", Bruin; IEEE, 1988, 404–410 IEEE V–MIC Conference, Jun. 13–14, 1988.

*Primary Examiner*—R. Bruce Breneman
*Assistant Examiner*—Linda J. Fleck
*Attorney, Agent, or Firm*—Keith E. Witek

[57] ABSTRACT

A method for planarizing a layer (18) begins by forming a layer (18) over a wafer having a substrate (12). Layer (18) has a surface topography which is not planar. A layer of material (20) is formed over the layer (18). The layer of material (20) has a surface which is more planar than the surface of layer (18). The surface of material (20) is transferred into the layer (18) by etching the layer (18) and the material (20) at approximately the same etch rate. The same etch rate is achieved by monitoring one of either the surface of the wafer or the etch environment of an etch system chamber. A computer-controlled feedback path alters an etch chemistry or etch environment to maintain the etch rates within an etch rate tolerance which is also referred to as a process window. By monitoring and altering the etch environment and/or the etch chemistry to maintain a process window, an optimal planar surface is achieved for layer (18).

32 Claims, 9 Drawing Sheets

LEAP ETCH RECIPE

| STEP | 1 | 2 | 3 | 4 |
|---|---|---|---|---|
| $CF_4$ | 85 SCCM | 85 | 77 | 77 |
| $CHF_3$ | 10 SCCM | 10 | 18 | 18 |
| $O_2$ | 18 SCCM | 10 | 5 | 0 |

METHOD FOR PROCESSING A LAYER OF MATERIAL WHILE USING INSITU MONITORING AND CONTROL

FIELD OF THE INVENTION

The present invention relates generally to semiconductor technology, and more particularly, to semiconductor process monitoring and control.

BACKGROUND OF THE INVENTION

Consistent and reliable etch processing is critical to the fabrication of integrated circuits (ICs). Etch processing is used to remove portions of layers of material to perform tasks such as forming contacts and vias, planarizing a layer of material, forming trench isolation, etching and defining interconnection layers, determine the size and shape of transistors, self-align portions of multiple layers of material, forming sidewall spacers, and is in general extensively used in IC processing. Integrated circuits are usually exposed to tens or hundreds of etch processing steps during their manufacturing cycle.

Most etch processing involves masking a layer of material with a lithographically-patterned masking layer, such as photoresist. The masking layer defines exposed portions of the layer of material and unexposed portions of the layer of material. The exposed portions of the layer of material are exposed to a chemical and/or mechanical etch process which may be a plasma etch, an isotropic etch, an anisotropic etch, a reactive ion etch (RIE), or like etch processes. The quality of an etch process is very dependent upon consistency, selectivity, and repeatability. For example, an etch process should etch across a wafer and an IC die in a uniform manner. The etch process should be able to etch one type of material (i.e. oxide) without significantly damaging or removing other materials (i.e. metals, silicon, polysilicon, nitride etc.). Furthermore, the etch process (i.e. etch rate, sidewall profile, selectivities, etc.) should not vary with time.

In order to achieve repeatability and consistency, an etch process may be performed in a timed manner (i.e. a timed etch). In a timed etch, an engineer assumes that the layer of material which requires etching is always consistently formed. For example, the layer of material is consistent in thickness, consistent in chemical composition, consistent in impurity concentration, consistent in topography, and the like. The engineer then calculates, given a fixed condition of the etch system (i.e. fixed temperature, fixed pressure, fixed gas flows, etc.), how much time it will take to properly etch the layer of material. The layer of material is then etched for the calculated time interval and hopefully the layer of material is properly etched. In many cases, after the timed etch is completed, a second timed etch is performed which is known as a "soft etch" or an "over etch." The over etch is a second etch process which continues beyond the timed etch to ensure proper etching of the layer of material. The over etch is usually an etch that is less aggressive (i.e. slower etch rate, better selectivities, etc.).

No process is completely consistent. Therefore, the thickness, chemical composition, impurity concentration, topography, and the like, of the layer of material will vary from die to die, wafer to wafer, machine to machine, and will vary across time as conditions change (i.e. $H_2O$ outgassing, polymerization of the etch chamber, changes in the flow of gases, etc.). Variations in etch processing, such as pressure variation, temperature variations, etc. are also possible. When variations in the layer of material and/or variations in the etch process occur, the timed etch may not etch properly, open circuits may occur where contacts were to be formed, excessive damage may be caused to underlying other exposed layers of material, photoresist loss may increase, short circuits may occur due to over-etching, and planarization processing may under-etch or over-etch the layer of material. Problems associated with microloading and macroloading are increased, and other known problems may also result. In general, timed etches are not adequately controlled to overcome inherent variations in integrated circuit processing.

Other etch processes include a resist etch-back technique which is used to form a planarized or smoothed layer of material. In general, a nonplanar layer of material is formed overlying a substrate. A planar photoresist layer is formed overlying the nonplanar layer of material. The photoresist layer and the layer of material are exposed to a timed-etch chemistry which etches the layer of material and the photoresist at the same etch rate, for example 500 Angstroms per minute. The planar surface profile of the photoresist is transferred/etched into the layer of material resulting in a planar layer of material.

As discussed above, variation in the layer of material, photoresist, and processing conditions, may result in the etch rate of the layer of material and the etch rate of the photoresist being unequal. The layer of material may then be over-etched, under-etched, and/or not completely planarized. Therefore, conventional resist etch-back techniques are not as reliable and consistent as desired.

To ensure consistent etch processing, endpoint detection may be used. Endpoint detection is an alternative to timed-etch processing. Endpoint detection methods monitor the optical spectrum of an etch chemistry environment. When various signals from the optical spectrum approach a certain rate of change or a certain absolute level, the etch is completed. Although endpointing results in a more reliable completion to an etch process, the endpoint technique does nothing to control the etch chemistry during the etch process. Therefore, etch rates, planarization, sidewall profiles, and the like are not always consistent.

In some cases, a process more advanced than endpointing: may be used to track etch progress. In some cases, the entire optical emission versus time of an entire etch process (i.e. from start to endpoint) is stored by a computer. After the etch is complete, the computer or a human user may compare the optical emission versus time to an optimal optical emission plot to determine if the etch was performed in an optimal manner. If the optical emission versus time is not optimal then an engineer is informed that the etch process is out of specification. Unfortunately, once the optical emission is compared in the computer, the etch has already been completed and the damage is already done. Subsequent process modifications will not repair the damage already done.

Another method which is used to improve etch process performance is a method known as a two-step etch. In general, a first etch chemistry or a first plurality of etch environment conditions is used to etch a layer of material for a fixed amount of time or until an endpoint is achieved. After the first etch chemistry completes its etching, a second etch chemistry or a second plurality of etch environment conditions is applied to the layer of material for a fixed time or until an endpoint is achieved. The two-step etch process is used to achieve improved selectivity but is not used to accurately control an etch process. In general, the two-step etch process is performing two back-to-back conventional etches and controlling and endpointing the etch environment in conventional manners (i.e. endpointing or timed etch).

In general, the methods described above are static solutions to a dynamic problem of varying equipment tolerances and specifications, varying process conditions, varying ambient environmental parameters, human error, gas flow variations, topographical variation, known loading effects, etc..

SUMMARY OF THE INVENTION

The previously mentioned disadvantages are overcome and other advantages achieved with the present invention. In one form, the present invention comprises a method for etching a layer of material in a semiconductor etch system. The method begins by exposing the layer of material to an etch environment. An etch rate of the layer of material is monitored. The etch environment is altered to maintain said etch rate at a selected etch rate which lies within a selected tolerance range.

The present invention will be more clearly understood from the detailed description below in conjunction with the accompanying drawings.

DESCRIPTION OF A PREFERRED EMBODIMENT

Figure 1:
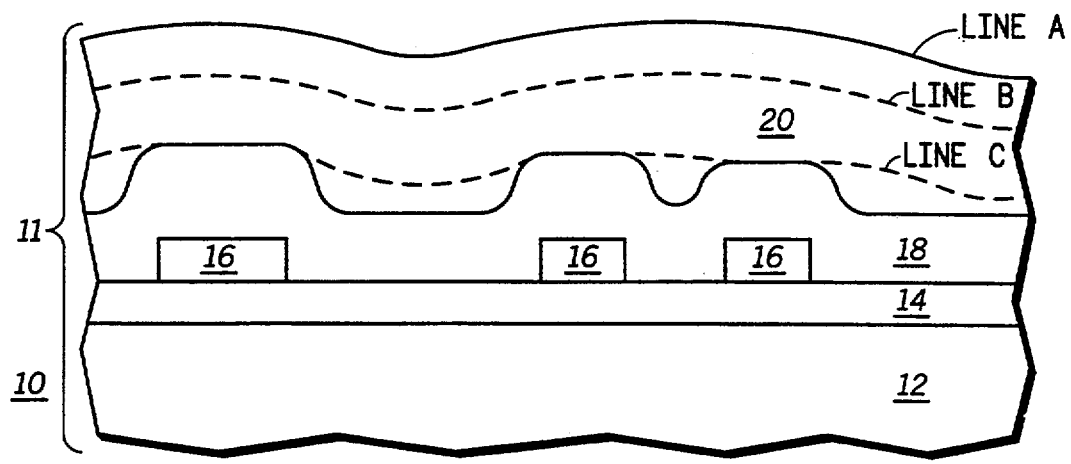
FIG. 1 illustrates, in cross-sectional form, a structure which may be processed in accordance with the present invention.

Illustrated in FIG. 1 is a structure suitable for planarization and/or etching in accordance with the present invention. A semiconductor equipment chamber 10 holds or supports a semiconductor wafer 11. The wafer 11 has a substrate 12. Substrate 12 may be made of silicon, gallium arsenide, silicon on sapphire (SOS), epitaxial formations, germanium, germanium silicon, diamond, silicon on insulator (SOI) material, recrystallized polysilicon, polysilicon, and/or like substrate materials. Preferably, the substrate 12 is made of silicon which is typically single crystalline. Diffusions (not illustrated) and buried layers (not illustrated) may be formed within the substrate 12.

A device layer 14 is illustrated in FIG. 1. Device layer 14 illustrates one or more layers of material which are able to be formed overlying substrate 12. Device layer 14 may include isolation structures such as trench isolation, local oxidation of silicon (LOCOS) isolation, polysilicon buffered LOCOS (PBL), field shield isolation, or the like. Device layer 14 may include oxide/dielectric layers such as wet or dry silicon dioxide ($SiO_2$), a nitride material, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$), titanium oxide, oxynitride, ferroelectric materials, and/or like dielectric materials. Device layer 14 may contain conductive layers such as epitaxial formations, germanium silicon layers, silicon on insulator (SOI) layers, recrystallized polysilicon, polysilicon, amorphous silicon, silicided layers, salicided layers, metal materials, refractory metals, metal composites, conductive oxides, and/or the like. Device layer 14 may form devices such as metal oxide semiconductor (MOS) transistors, bipolar transistors, diodes, thin film transistors (TFTs), SOI transistors, capacitors, logic gates, resistors, and the like. In general, device layer 14 illustrates that the process taught herein may be used at any time during the processing of an integrated circuit (IC).

A patterned layer of material forms regions 16. Regions 16 are usually conductive regions such as polysilicon regions or metal regions. The regions 16 and layer 14 forms a topography of wafer 11 which is non-planar. In some cases, a severe topography will result from the formation of regions 16. For example, metal layers may result in vertical height variations in wafer 11 on the order of several microns. In general, any selectively formed or patterned layer of material will form a non-uniform topography over an integrated circuit surface.

In FIG. 1, a dielectric layer 18 is formed overlying the regions 16. Usually, layer 18 is one of either BPSG, a TEOS-based oxide, silicon nitride, silicon dioxide, or a like dielectric layer. Preferably layer 18 is a TEOS-based oxide. Composite oxide materials may be used to form dielectric layer 18. Usually dielectric layer 18 is deposited but layer 18 may also be grown in some embodiments. When layer 18 is formed, layer 18 is usually conformal (i.e. follows the underlying surface topography as illustrated).

A layer of material 20 is formed overlying the layer 18. Material 20 is any layer of material which has a more planar surface than the surface of layer 18. Furthermore, material 20 should be capable of being etched at approximately the same etch rate as layer 18. For these reasons, material 20 is usually a photoresist material or a like spun-on polymer. In other embodiments, material 20 may be a spin on glass (SOG), a reflowed oxide, or the like.

A non-uniform topography causes many known problems. One problem is poor photolithographic features due to the depth of focus of a photolithographic system. Another problem is a structure or phenomenon known as "stringers" which is an etch-related problem. Other etch selectivity-related difficulties arise when etching severe topography. Interconnect resistance increases. Conformal coverage of films is more difficult to achieve. Severe topography along with sharp angles and edges causes increases in electric fields, increases the possibility of forming an electrical short circuit, and increases capacitive coupling and cross-talk. In general, a planar surface is much more easier to subsequently process than a surface which has severe topography.

In FIG. 1, the material 20 is etched by an etch chemistry within a semiconductor equipment etch system. An example etch chemistry may comprise a $CF_4/CHF_3$ mixture although other resist/oxide etch chemistries exist. The etch chemistry may be carried by an inert carrier gas such as nitrogen, argon, or the like. The surface of material 20 is etched away from a Line A to a Line B based upon an etch rate which is defined by the etch chemistry and the parameters of an etch chamber environment. The parameters of the etch chamber environment (i.e. pressure, temperature, electrode separation, gas flows, voltage potential, energy, chamber dimensions, chemical species in the etch chemistry, and gas concentrations) are determined by the semiconductor equipment etch system or a computer. Etching continues until the surface of material 20 is etched to Line C wherein a surface of the layer 18 is exposed.

Figure 2:
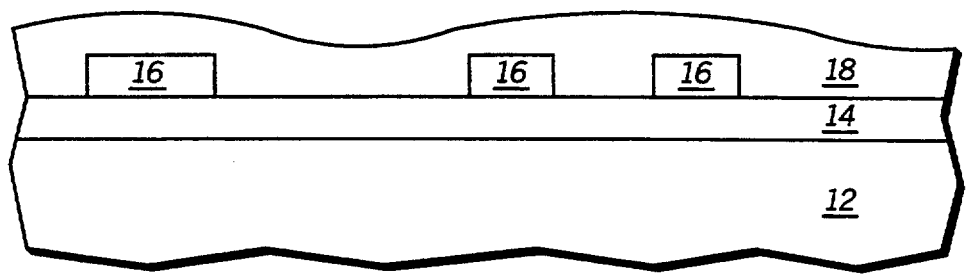
FIG. 2 illustrates, in cross-sectional form, the structure of FIG. 1 after being etched by a controlled etch process in accordance with the present invention.

At this point in time, the etch chemistry begins to etch layer 18. If the etch rate of layer 18 and the etch rate of material 20 are kept equal or nearly equal (i.e. within roughly 10% of each other), the planar surface of the layer of material 20 is etched/transferred into the layer 18 as illustrated in FIG. 2. At a very minimum local planarization is achieved, and global planarization is possible under certain conditions.

Due to the etching of layer 18, oxygen is released into the ambient environment if the layer 18 is an oxide material or oxide compound. Material 20 is usually made of a photoresist material, and oxygen etches photoresist. Therefore, once the layer 18 is exposed and begins etching, oxygen released from the etch reaction alters the etch rate of the photoresist (i.e. material 20).

The etch rate of the photoresist will increase as oxygen concentration increases. This alteration in etch rate is undesirable due to the fact that a non-planar surface will result in layer 18. Furthermore, etch rate variations always occur via known $H_2O$ outgassing, chamber polymerization, variations in film thickness (i.e. variations in deposition thickness), variations from wafer to wafer, variations from lot to lot, contamination, and tolerances/variations in the etch chamber environment and etch chemistry. These variations result in a non-planar surface of layer 18.

Figure 3:
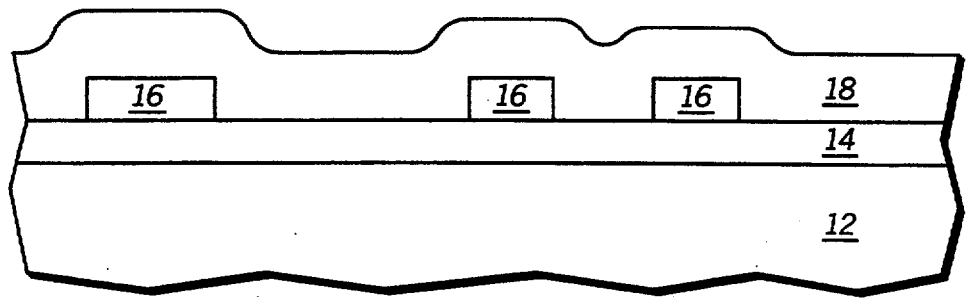
FIG. 3 illustrates, in cross-sectional form, the structure of FIG. 1 after being etched by an uncontrolled etch process.

For example, FIG. 3, illustrates the topography that results when the layer of material 20 etches faster than the layer 18. The topography of layer 18 is reduced (i.e. step height reduction is achieved) as can be seen by comparing FIG. 1 to FIG. 3, but the surface of layer 18 is still not as planar as desired.

Figure 4:
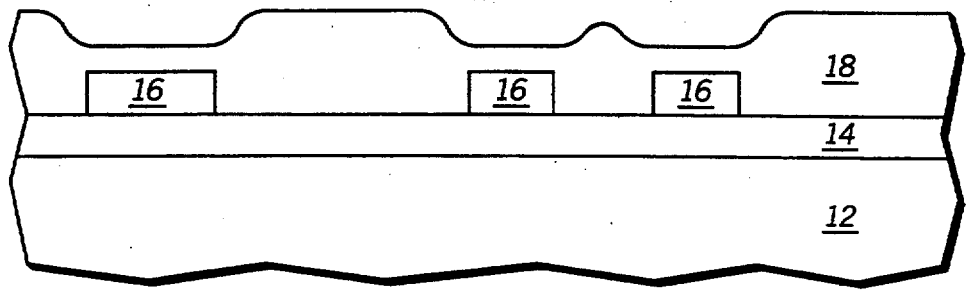
FIG. 4 illustrates, in cross-sectional form, the structure of FIG. 1 after being etched by another uncontrolled etch process.

In FIG. 4, the layer of material 20 etched slower than the layer 18, and the resulting surface of layer 18 is illustrated. The surface of layer 18 is non-planar due to the variations in etch rate. Therefore, variation in the etch rate between the material 20 and the layer 18 should be minimized for formation of a more planar surface as illustrated in FIG. 2.

Figure 5:
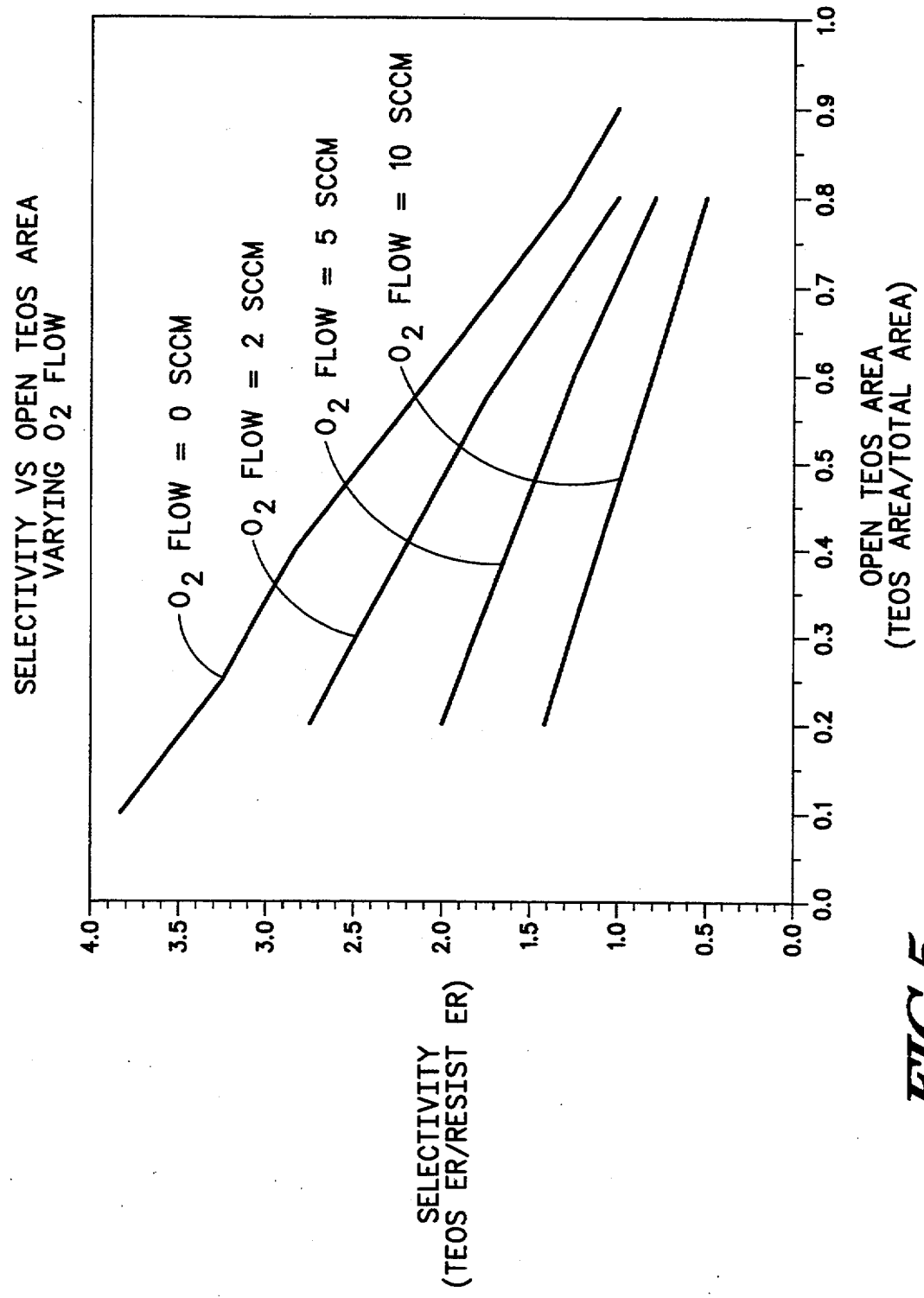
FIG. 5 illustrates in a graph the correlation between tetraethylorthosilicate (TEOS-based) oxide and photoresist selectivities as a function of exposed TEOS surface area in accordance with the present invention.

FIG. 5 illustrates the etch selectivity of oxide to photoresist for four different oxygen flow rates passed individually through an etch system. The selectivity, illustrated on the Y-axis, is the oxide etch rate divided by the photoresist etch rate. For an ideal planarization process, the selectivity should be one throughout the entire etch process. A selectivity of one means that the photoresist and the TEOS are etching at an equal rate. The X-axis illustrates the exposed TEOS surface area as a function of the wafer surface area. When the etch begins, only photoresist is exposed and the exposed TEOS area is zero percent. Once the resist is etched away to a certain point, TEOS begins to be exposed. Once TEOS is exposed, oxygen is released to the ambient etch environment and the selectivity is altered as illustrate in FIG. 5. Selectivity decreases as the photoresist etch rate increases.

The TEOS exposure percentage goes from 0% to 100% in some function determined by wafer topography. The transition from 0% to 100% may be as abrupt as a step function, or may take several minutes. Different integrated circuits, different lots, and different wafers will each have a different transition curve from 0% TEOS area exposed to 100% TEOS area exposed. FIG. 5 illustrates that even for a single wafer a fixed/static oxygen flow rate will not achieve the desired selectivity (selectivity=1) for the entire etch process. Furthermore, wafer to wafer variations, lot to lot variations, equipment system to equipment system variations, and integrated circuit to integrated circuit variations make a static etch process gas flow undesirable. Therefore, gas flow should be altered in an insitu manner to optimize process selectivity over time. In addition, etch environment conditions such as semiconductor etch system chamber pressure, semiconductor etch system chamber temperature, semiconductor etch system voltage potential, semiconductor etch system chamber energy, semiconductor etch system chamber dimensions, semiconductor etch system electrode separation, semiconductor etch system gas flow, semiconductor etch system chamber chemistry, and/or semiconductor etch system ambient gas concentrations may be dynamically altered to affect the selectivity. In general, one or more dynamic alterations must be performed to the etch environment in an insitu manner in order to result in an optimal selectivity for the entire etch process.

Figure 6:
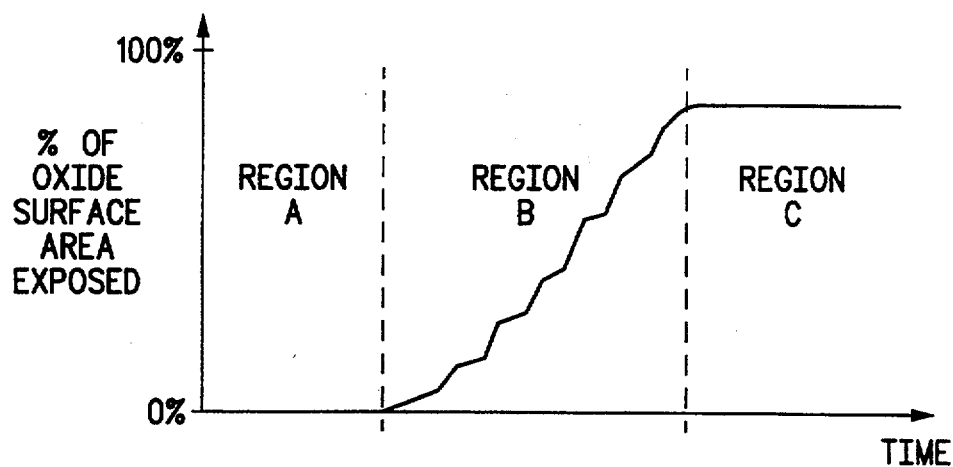
FIGS. 6-8 each illustrate in a graph one plot of the percentage of TEOS oxide surface area exposed over time during a selected planarization etch process in accordance with the present invention.
Figure 7:
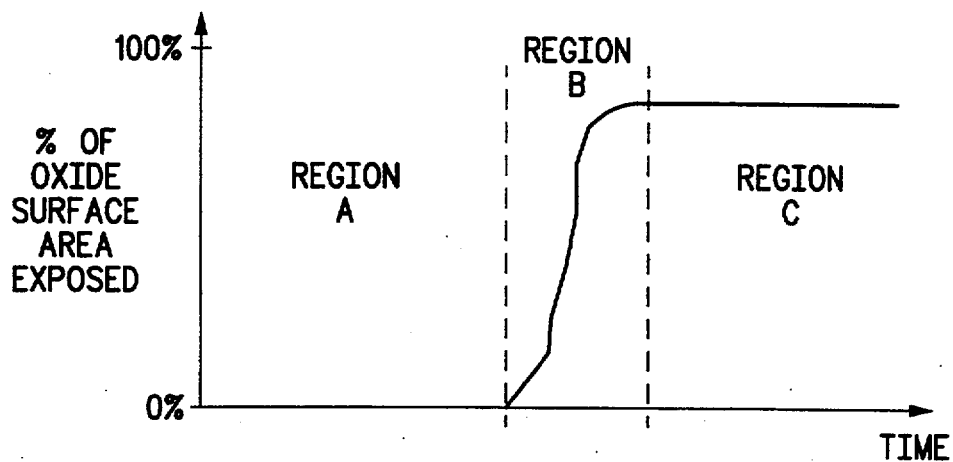
Figure 8:
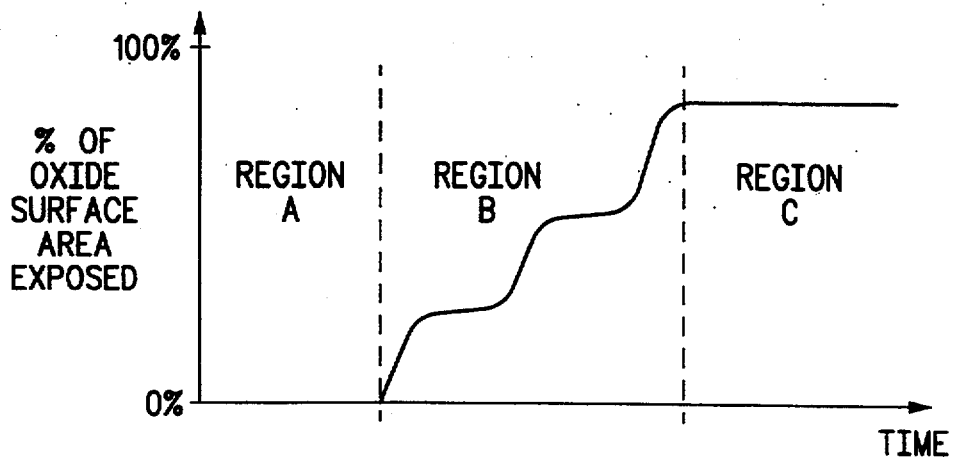

FIGS. 6–8 each illustrates a graph of percentage of exposed oxide surface area versus etch time. In FIG. 6, Region A is a region of time wherein only photoresist (i.e. material 20 of FIG. 1) is etched. In region A, no oxide surfaces are exposed. In region B, a small initial percentage of the oxide layer is exposed and, as the photoresist etches away, the exposed percentage gradually increases until 100% of the oxide surface area is exposed and etched. In region C, only oxide (layer 18) is etched due to the fact that all of the photoresist (material 20) has been removed. If the selectivity is kept at a value of one, the layer 18 will have a substantially planar surface. A large majority of the etch rate/selectivity changes will occur during Region B. Gradual changes during Region B as illustrated in FIG. 6 are typically characteristic of wafers which contain a microprocessor or a microcontroller.

In FIG. 7, Region A is a region of time wherein only photoresist (i.e. material 20 of FIG. 1) is etched. In region A, no oxide surfaces are exposed. Region B is a region of time wherein the exposed surface area of oxide goes from 0% to 100%. The Region B in FIG. 7 is more abrupt than the Region B of FIG. 6. FIG. 7 is more characteristic of repetitive topographical parts, such as DRAMs, SRAMs, EPROMs, flash EPROMs, EEPROMS, non-volatile memories, and other repetitive topographical circuits. In Region C, 100% oxide area is exposed and etched.

In FIG. 8, Region A is a region of time wherein only photoresist (i.e. material 20 of FIG. 1) is etched. In region A, no oxide surfaces are exposed. Region B is a region of time wherein the exposed surface area of oxide goes from 0% to 100%. The integrated circuit used to graph FIG. 8 has an oxide topography wherein roughly 30% of the surface lies at a first height, 30% of the surface lies at a second height which is less than the first height, and 30% of the surface lies at a third height which is less than the second height. In Region C, 100% oxide area is exposed and etched.

FIGS. 6–8 illustrate that different IC parts expose oxide surface areas at different starting times, different ending times, at different functions of time, and at different rates. A single static process is therefore not desirable for use on all of the integrated circuit topographies illustrated via FIGS. 6–8. Also, FIG. 5 illustrates that three different static processes, one process for each part, is not feasible due to the fact that during Region B in FIGS. 6–8 the selectivity can change drastically. Therefore, a dynamic process is required to result in a selectivity of one and an optimized planar surface of layer 18.

A dynamic process may be achieved by monitoring the etch rate of the layer of material 20 and the layer 18 via a laser, a monochrometer, a collimated light source, a polarized light source, an optical detector, a spectrum analyzer, a mass spectrometer, an interferometer, or the like. Any etch, such as a reactive ion etch (RIE) etch, an isotropic etch, an anisotropic etch, a plasma etch, a batch etch, a single-wafer etch, or the like may be monitored by at least one of the above devices. The information gathered from these devices can be relayed to a computer, a display screen, or a human user. The computer or human user can collect or store correlation data between etch rates/selectivities and the oxygen concentration, chamber pressure, temperature, electrode separation, gas flows, voltage potential, energy, chamber dimensions, chemical species in the etch chemistry, gas concentrations, and/or the like. Once the computer or human user determines that the etch rate or selectivity is adversely changing in time, the above listed parameters can be altered to bring the selectivity or etch rate back into specification (i.e. a tolerable range).

Figure 9:
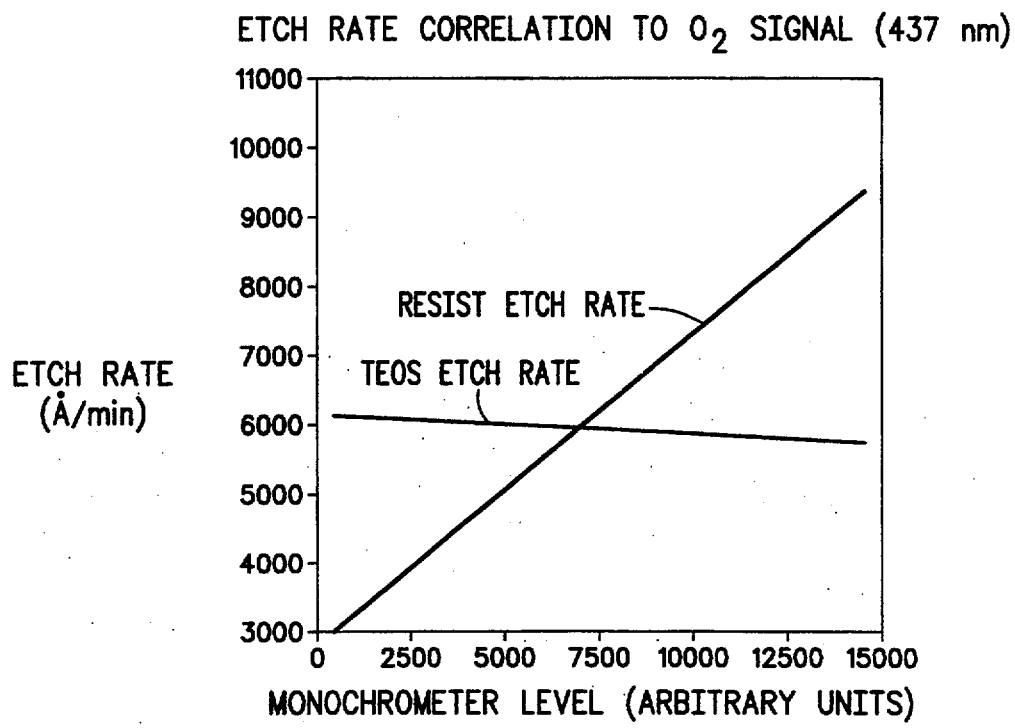
FIG. 9 illustrates in a graph the correlation between both tetraethylorthosilicate (TEOS-based) oxide and photoresist etch rates as a function of a monochrometer oxygen reading measured at 437 nanometers in accordance with the present invention.

For example, FIG. 9 illustrates a monochrometer count on an X-axis and an etch rate on a Y-axis. The monochrometer count is a measurement of the amount of oxygen in a plasma etch environment. The oxygen is measured by reading spectral emissions around 437 nanometers. Other oxygen emission lines exist and may also be used, such as 533 nanometers. Other wavelengths may be required to detect other gases, elements, and chemicals. A plurality of monochrometers may be used. Furthermore, many optical emission frequencies can be simultaneously or sequentially monitored (e.g. any frequency between 200 nm and 800 nm).

FIG. 9 illustrates that a TEOS etch rate decreases as oxygen concentration increases. Furthermore, from FIG. 9 it is evident that the photoresist etch rate drastically increases with increasing oxygen concentration in the plasma environment.

Figure 10:
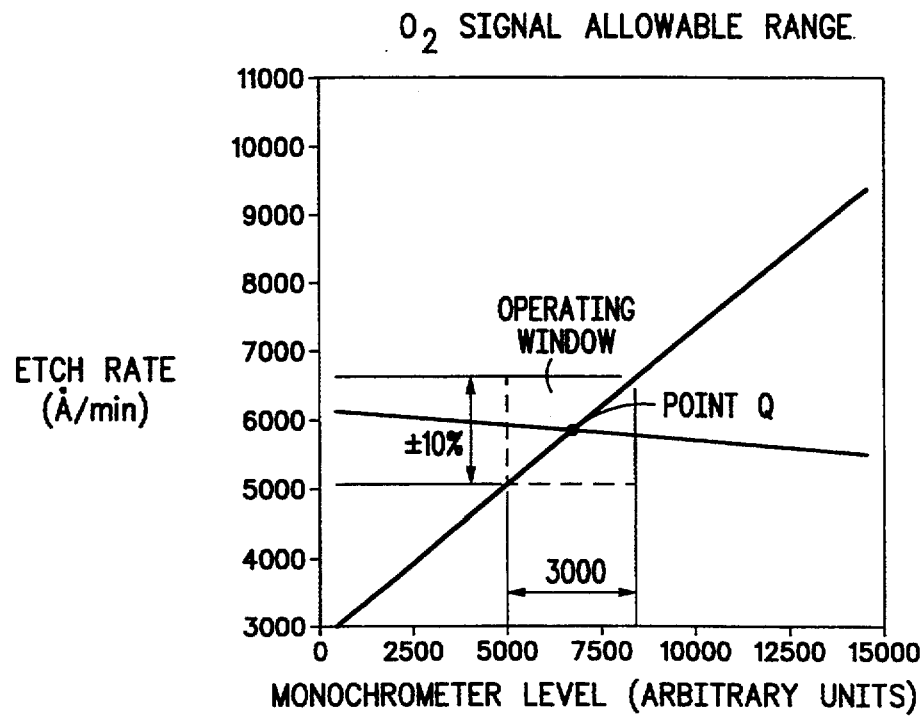
FIG. 10 illustrates in a graph one example of a process operating window for an etch process used to planarize a TEOS oxide via a photoresist etch-back technique in accordance with the present invention.

FIG. 10 illustrates how to perform a planarizing resist etch-back process in order to form a very planar surface. Ideally, an engineer would like to operate at Point Q wherein the selectivity is always equal to one. To operate at the Point Q would require constant monitoring and adjustment via a computer program. This computer accuracy may not be necessary in all cases. In order to form a locally planar surface, it has been experimentally determined that the etch rate of the photoresist and the etch rate of the oxide (i.e. selectivity) must not vary by more than roughly 10%. This criterion results in the definition of an operating window illustrated in FIG. 10. The operating window of a 10% shift in etch rates results in an acceptable monochrometer shift of roughly +/−1500 counts from 6500 counts.

A correlation has now been made between etch rates/selectivity and monochrometer readings of oxygen concentration. A computer or a human operator may monitor the count value and alter the oxygen flow to maintain a process within the 10% operating window regardless of process variations, equipment tolerances, wafer to wafer variation, lot to lot variation, die variation, and the like. For example, all of the transitions illustrated in FIGS. 6–8 will be processed within the 10% process window via computer feedback control or human operator control. If the oxygen count drops below 5000, more oxygen is added to the processing chamber until the 10% window is maintained. If the oxygen count rises above 8000, less oxygen is added to the processing chamber until the 10% window is maintained.

Note that other correlation curves may be derived for etch rate/selectivity versus chamber pressure, temperature, electrode separation, gas flows, voltage potential, energy, chamber dimensions, chemical species in the etch chemistry, gas concentrations, and/or the like. These parameters can then be used to alter etch rates and selectivities. Also note that a 20% operating window, 5% operating window, 1% operating window, or other operating window can be easily achieved given the process discussed herein.

Figure 11:
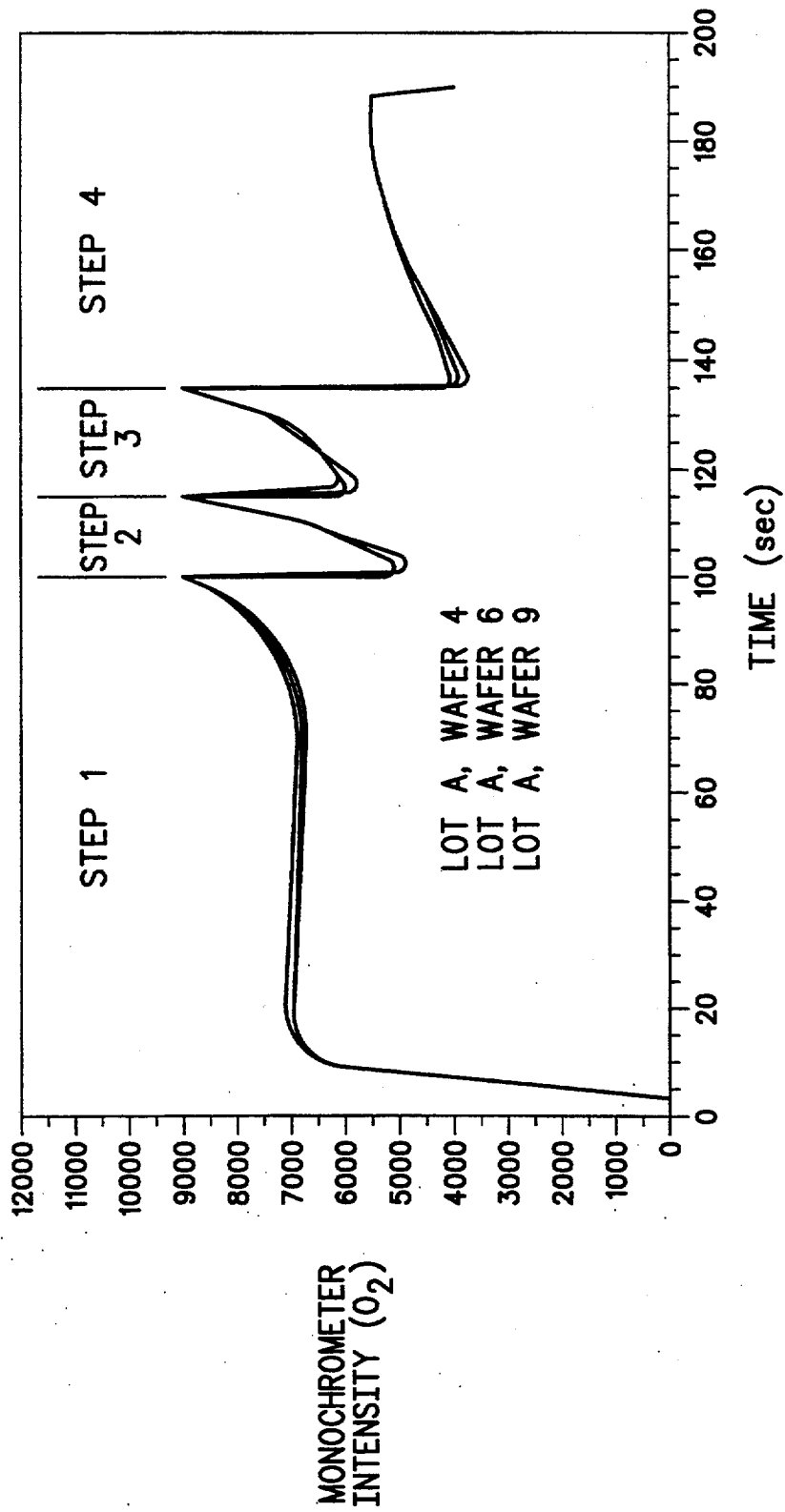
FIG. 11 illustrates in a graph a set of monochrometer intensity measurements for oxygen in an etch chamber as a function of etch time wherein the etch method is in accordance with the present invention.

FIG. 11 illustrates a graph of monochrometer readings versus etch time. Initially, in the beginning of Step 1, only photoresist (i.e. material 20 of FIG. 1 ) is etched.

At the end of Step 1, the monochrometer reading begins to increase. This increase indicates that the oxide layer is beginning to be exposed. Oxygen is being released to the etch chamber environment by the etching of the oxide and the increased oxygen is affecting the photoresist etch rate. Once the monochrometer count (i.e. the etch rate of photoresist) reaches a certain predetermined upper limit, the oxygen flow is decreased via a beginning portion of Step 2. The 10% operating widow of FIG. 10 is maintained. At the end of Step 2, more oxide is exposed and therefore more oxygen is released into the plasma etch chamber. In Step 3, the oxygen concentration/flow is reduced again to maintain the 10% operating window. Finally, in step 4, another reduction in oxygen flow occurs because the oxygen concentration has reached the upper limit. In step 4 a horizontal trace indicates that the process is etching only oxide and that all the resist is removed. Time or endpointing may be used to terminate the etch/feedback process within step 4.

A lower limit may also be defined along with the upper limit. In this particular embodiment a lower limit may not be needed due to the fact that the oxygen concentration will always increase.

In FIG. 11, N discrete chemistry reduction steps are performed, where N is an integer. In the cases where oxygen concentration deviation is slow and the process window is large, finite quantum changes are acceptable. For a more controlled process window (i.e. 0.5% process window), a computer may have to constantly and dynamically alter the oxygen concentration or other process variables several times a second.

Figure 12:
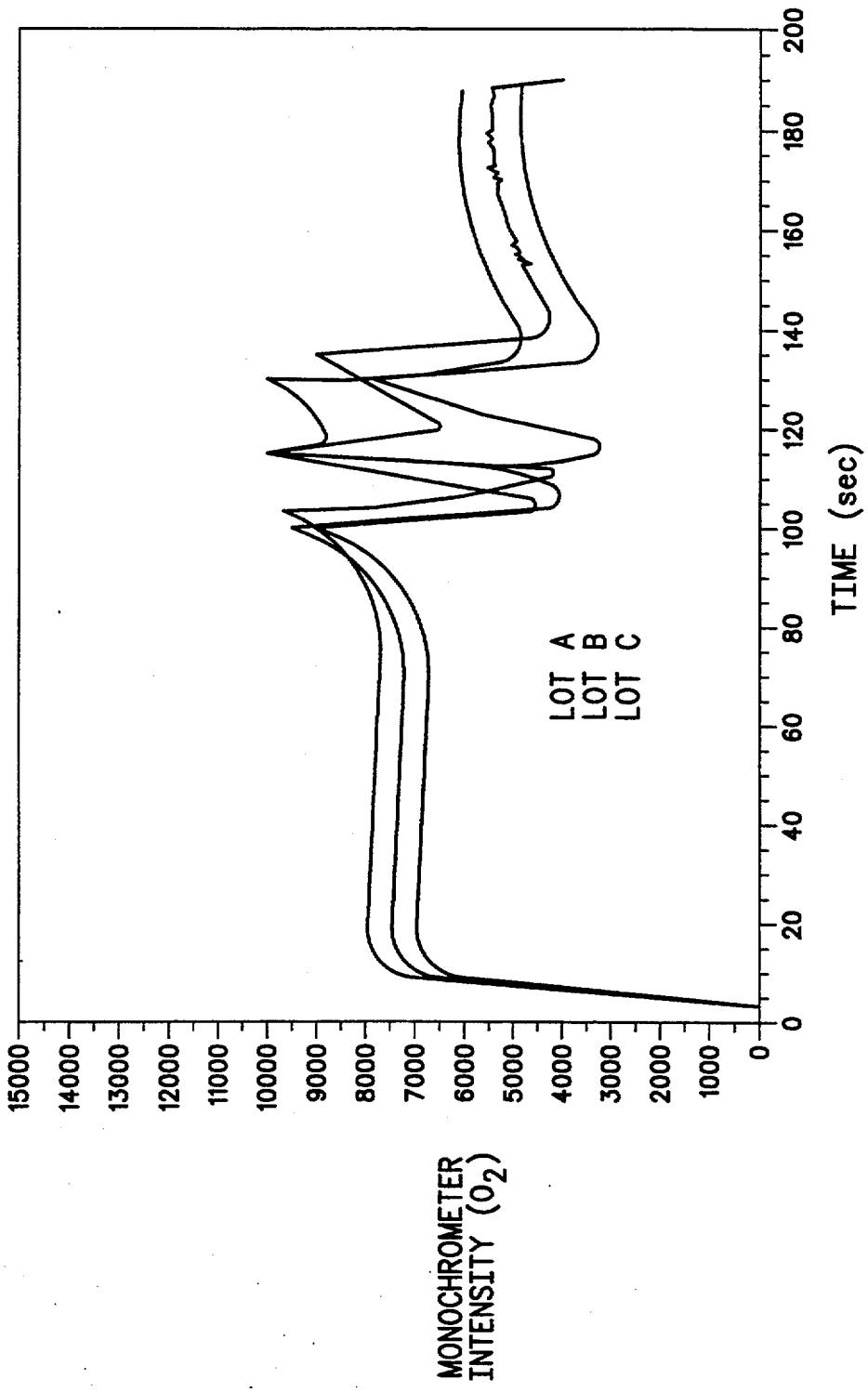
FIG. 12 illustrates in a graph another set of monochrometer intensity measurements for oxygen in an etch chamber as a function of etch time wherein the etch method is in accordance with the present invention.

FIG. 12 illustrates that the method described in FIG. 11 may be used on many different product lots and maintain an operating window regardless of the manner in which oxygen increases or variables change. Three different wafers from three different product lots are illustrated in FIG. 12.

Figures 13, 14:
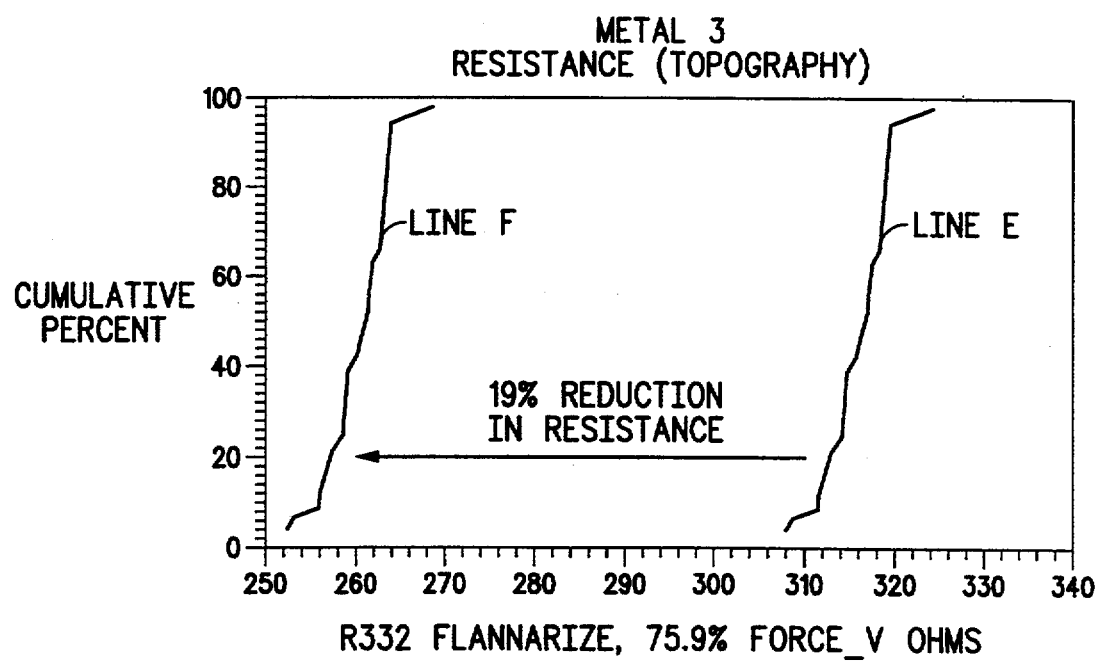
FIG. 13 illustrates, in a table, various etch parameters and conditions used in each etch step 1 through 4 of FIG. 12.
FIG. 14 illustrates in a graph the reduction in metal interconnect resistance due to etching with an etch method in accordance with the present invention.

FIG. 13 is an example process table of the etch process used for the four steps illustrated in FIG. 11. Throughout the process one or more variables may be altered by the human user or by a computer to maintain the selected process window. In FIG. 13, the flow of both $CF_4$ and $CHF_3$ is altered as a function of time (i.e. as a function of changing oxygen concentration) to maintain certain process results and process windows. Furthermore, the oxygen flow is reduced throughout each of the Steps 1–4 of FIG. 11 as illustrated in FIG. 13.

FIG. 14 illustrates that a layer of metal material which is formed overlying a planarized dielectric which is planarized by the process taught herein has a reduced resistance. A metal layer formed over a surface which is non-planar is illustrated by Line E. Line F illustrates the resistance of a metal line formed over a planar surface formed by the methods taught herein. The Line F indicates that forming a metal interconnect over a planar surface may result in a resistance reduction of roughly 20%. The specific reduction in resistance is topography dependent and will vary from lot to lot.

Reduced resistance in interconnect layers is desirable. A metal layer which is formed over a surface having a severe topography has a longer length than a metal layer traveling the same horizontal distance over a flat surface. This longer length results in an increased resistance. Therefore, a planar surface is desired to reduce interconnect length. Furthermore, when a metal layer covers severe topography the metal layer may thin in some areas causing increases in resistance. Adverse metal layer thinning does not occur to a large extent over a smooth/planar surface, and resistance is therefore improved.

Figure 15:
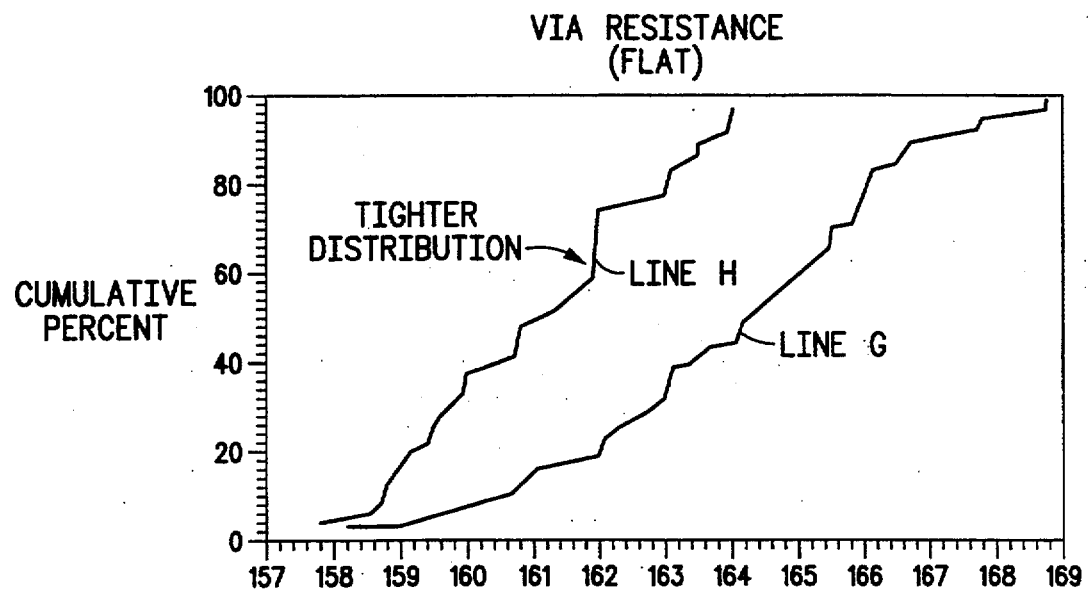
FIG. 15 illustrates in a graph the reduction and reduced distribution in metal via resistance due to etching with an etch method in accordance with the present invention.

FIG. 15 illustrates that both a reduction in contact/via resistance and a reduction in contact/via resistance distribution will result from forming contacts/vias through a planarized surface formed by the process taught herein. Line G illustrates contact/via resistance of contacts/vias formed over a severe topography. Line H illustrates the resistance of contacts/vias formed through a planarized surface. A planar surface allows for the formation of contacts/vias which are formed to a consistent depth and are formed having a tighter geometric distribution.

In the integrated circuit industry, planarization is difficult to achieve by conventional processes. Furthermore, even processes which are being tested and developed at a rapid rate, such as chemical mechanical polishing (CMP), have some disadvantages. CMP is expensive. The CMP equipment is costly, CMP wafer throughput is low and costly, CMP processing is inherently dirty and a source of particles and contamination, special fabrication facility areas are costly and usually required for CMP processing, CMP is not always reliable, and CMP equipment is physically large and is therefore expensive to own, maintain, and operate. The process described herein is cheaper to use, maintain, and integrate into current processing equipment systems and fabrication facilities. Furthermore, the throughput is higher and the costs are lower for the method taught herein versus CMP processing, which is expensive as indicated above and has consumable costs relating to polishing pads. The results of the technique taught herein are comparable to CMP and in many ways the process is more reliable and repeatable.

Figure 16:
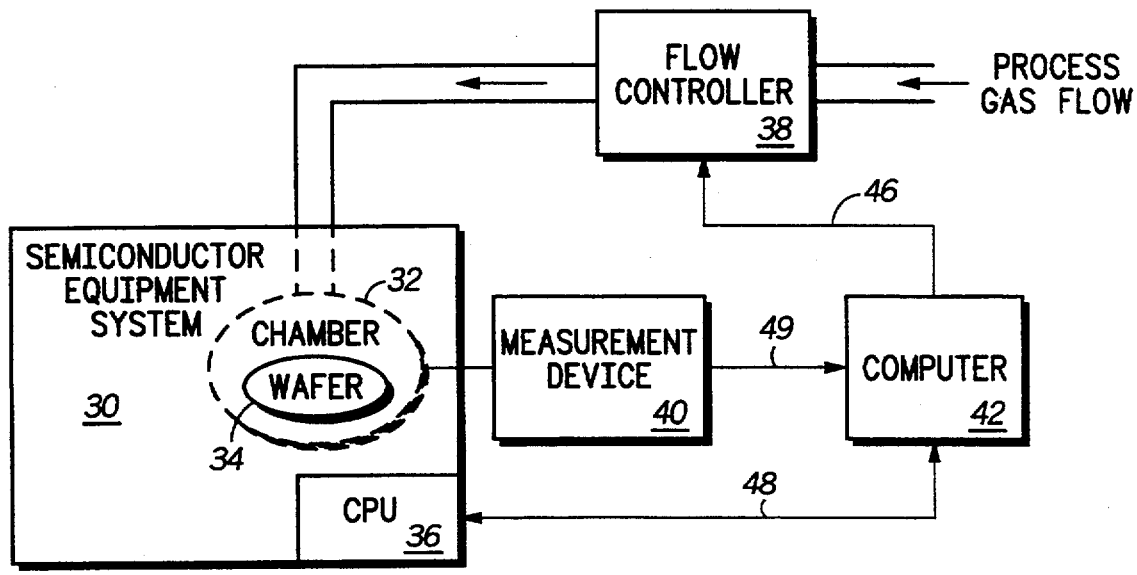
FIG. 16 illustrates in a block diagram an apparatus which may be used to etch a wafer in accordance with the present invention.

FIG. 16 illustrates a hardware system which may be used to perform the process described above. FIG. 16 illustrates a semiconductor equipment system 30. The semiconductor equipment system 30 has a chamber 32 and at least one wafer 34 which is supported within the chamber 32. More than one wafer 34 may be placed into the chamber 32 if the system 30 is a batch processing system. Single wafer systems may also be used. A central processing unit 36 (CPU) is used to control the semiconductor equipment system 30. A measurement device 40 is used to measure the chamber's environmental conditions and/or the chamber's environmental chemistry. The device 40 may be implemented by at least one monochrometer, interferometer, laser, mass spectrometer, spectrum analyzer, polarized light source, collimated light source, a plurality of measurement devices, or a like chamber measurement device. Measurement device 40 is coupled to the chamber 32 via an optical or mechanical media 44. In many cases the device 40 is mounted directly onto the chamber 32 or the system 30.

Device 40 is connected to a computer 42 via a conductor 49. The computer may be hardwired logic, a personal computer (PC), a workstation, a mainframe, a supercomputer, or the like. Conductor 49 may be one or more of an ethernet connection, a bi-directional conductor, a single wire, a group of wires, one or more coaxial cables, a communication bus or peripheral, an RS-232 connection, an IEEE-488 connection, a wireless connection or the like. The computer 42 is connected to the CPU 36 via one of either a uni-directional or a bi-directional connection illustrated by a conductor 48.

In some cases, system 30 may have a CPU 36 that is so advanced that the CPU 36 may also function as the computer 42. In other cases, the system 30 may lack advanced CPU capability and may require computer 42 to perform many system internal tasks and function as the CPU 36. In modern fabrication environments, the system 30 usually has a distinct CPU 36, and the computer 42 is a separate and distinct microprocessing device such as a personal computer (PC). In general, the CPU 36 and/or the computer 42 will control some or all chamber conditions such as pressure, electrical potential, gas flows, and temperature.

A conductor 46 couples the computer 42 to a flow controller 38. The controller 38 may be referred to as a mass flow controller (MFC). In many cases, a plurality of flow controllers is used due to that fact that more than one chemical species or compound is made available to the chamber 32. For example, a system 30 may have access to $O_2$, $CHF_3$, $CF_4$, $SF_6$, Ar, $N_2$, $Cl_2$, $NF_3$, or other chemical etchants wherein each chemical is provided via one or more MFCs. In this case, the computer 42 has access to any MFC that requires insitu adjustment. A first feedback path is formed via the media 44, device 40, conductor 49, computer 42, conductor 48, CPU 36, and chamber 32. A second feedback path is formed via the media 44, device 40, conductor 49, computer 42, conductor 46, controller 38 and chamber 32.

The computer measures the environment within the chamber 32. Once a deviation from an optimal operating point or operating process window is determined by the computer 42, the computer 42 alters the environment of the chamber 32 to bring the process back to the operating point or back within the operating window. In order to control the environment, the computer 42 may have to alter the flows through the controller 38 and/or alter the environment (i.e. pressure, temperature, etc.) via the CPU 36.

Figure 17:
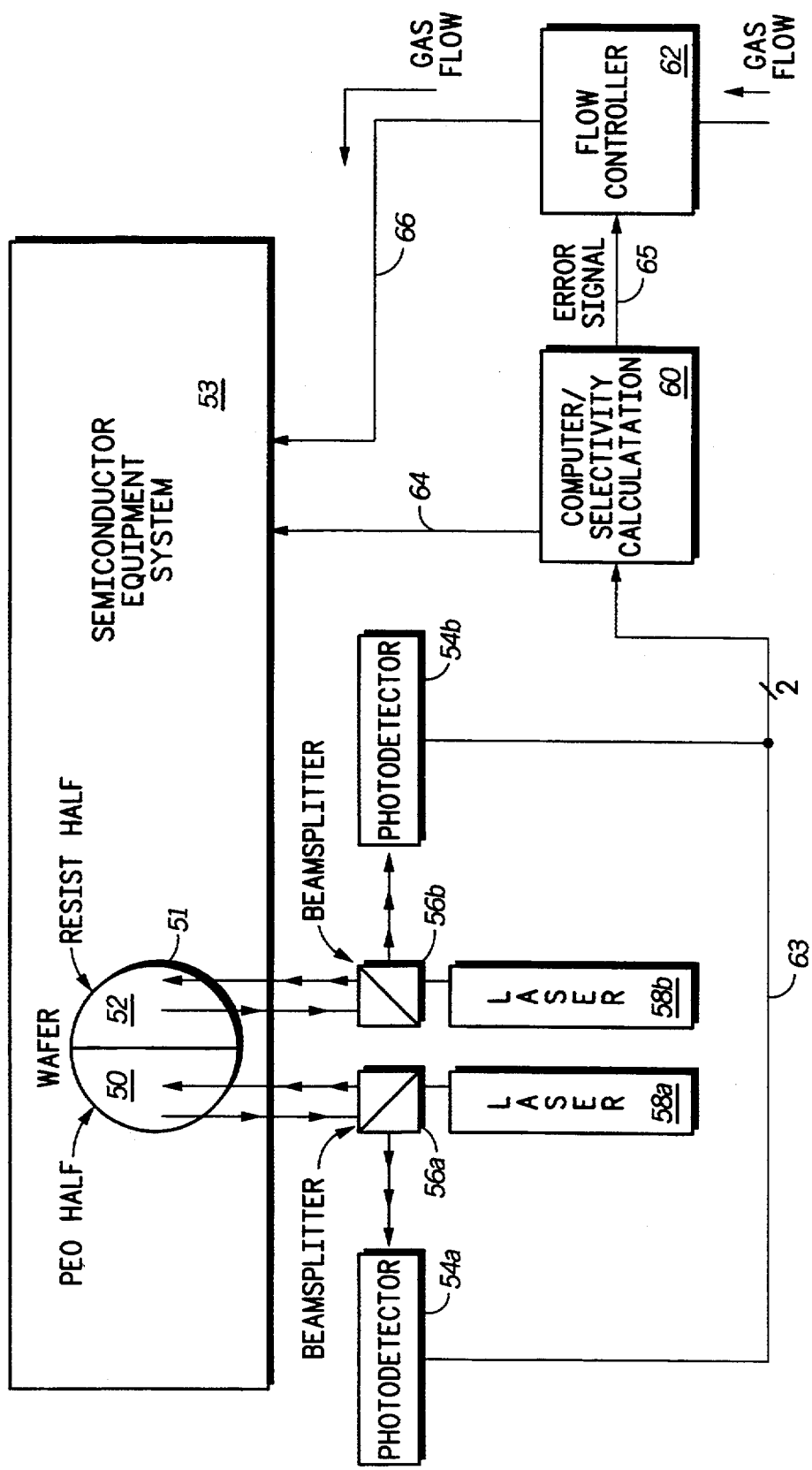
FIG. 17 illustrates in a block diagram another apparatus which may be used to etch a wafer in accordance with the present invention.

FIG. 17 illustrates another system which may be used to perform the process taught herein. FIG. 17 illustrates a water 51 which has a plasma enhanced oxide (PEO) portion, referred to as a dielectric portion 50 and a photoresist portion 52. The wafer is positioned in a chamber of a semiconductor equipment system 53. The system 53 is, in this case, a batch etch system. Wafer 51 is a dummy etch monitoring wafer and other product wafers are positioned within the chamber adjacent the wafer 51. The product wafers have a layer of material similar or identical to the portion 50 of wafer 51. This layer of material is to be planarized. A photoresist layer or a like layer which is similar or identical to the portion 52 of wafer 51 is formed over the product wafers. This photoresist layer is formed over the layer of material and is used to achieve in-situ controlled etch-back planarization.

A first laser 58a or a like energy source passes a first laser beam through a first beamsplitter 56a. The first laser beam reflects off of the surface of the portion 50 as graphically illustrated in FIG. 17. The beamsplitter 56a directs the laser beam to a photodetector 54a which analyses the laser beam. The laser beam reflection off of the surface of wafer 51 generates a sinusoidal interference pattern which can be used during etch processing to determine the etch rate of the portion 50 (i.e. the dielectric layer of material). The etch rate data is transmitted to a selectivity calculation machine or a computer 60 via a conductor 63.

A second laser 58b or a like energy source passes a second laser beam through a second beamsplitter 56b. The second laser beam reflects off of the surface of the portion 52 as graphically illustrated in FIG. 17. The beamsplitter 56b directs the laser beam to a photodetector 54b which analyses the laser beam. The laser beam reflection off of the surface of wafer 51 generates a sinusoidal interference pattern which can be used during etch processing to determine the etch rate of the portion 52 (i.e. the photoresist portion). The etch rate information is transmitted to the computer 60 via the conductor 63.

The computer 60 uses the data received from the photodetectors 54a and 54b to alter the process conditions, process time, process environment, and/or process chemistry as taught herein. The computer 60 can control semiconductor equipment system 53 via a conductor 64, and can control gas flows via a flow controller 62 which is connected to the computer 60 by a conductor 65. Process gases flow through piping referred to as a path 66. The process chemistry, process environment, etc. is altered to keep the etch rate of portion 50 and the etch rate of portion 52 within a process point or a process window to ensure accurate etching and planarization.

It should be understood that the dummy wafer 51 may also be a product wafer. The laser 58a may be positioned to monitor a first area of the product wafer which is likely to expose the dielectric layer requiring planarization. The laser 58b may be positioned to monitor a second area of the product wafer which exposes predominantly photoresist. The same optimal planarization results via feedback control is achieved. In addition, a single wafer etch system can now be used.

The computers illustrated in FIGS. 16 and 17 may be replaced by human users. The human user may monitor the equipment systems or monitor process progress via a terminal screen and adjust the process environment manually. This process, although feasible, is more prone to error and definitely less advantageous than a computer controlled process.

It should be noted that the process described herein of monitoring and altering etch chemistries and environments may be used for purposes other than etch planarization. Any etch process may benefit from this process. Known macroloading effects and lag effects may be reduced via the process taught herein. Other processes such as sputtering, deposition, epitaxial growth, thermal cycles, and the like could benefit from insitu monitoring and insitu process alterations as taught herein.

Tungsten, titanium tungsten, titanium nitride, silicided layers, and the like are popular materials in the integrated circuit industry. These layers and materials are troublesome if not processed properly. For example, if a tungsten region is formed as a contact plug, an interconnect, or an etched-back layer over a severe topography, known stringer structures will occur. Stringers are spacer formations which are undesirable and may cause yield reductions. These stringers are avoided when tungsten and like materials are processed over a planar surface having sidewalls with an angle of less than roughly 30° to 45°. Experimental lots using the process taught herein have resulted in planarized surface sidewall profiles of roughly 5° or less. Therefore, the process taught herein may be used to provide a more compatible environment for processing which requires refractory metals and the like.

While the present invention has been illustrated and described with reference to specific embodiments, further modifications and improvements will occur to those skilled in the art. For example, a dielectric layer, a semiconductive layer, or a conductive layer may be planarized via the process taught herein. The chemistry used to planarize may be altered. Etching contacts/vias, forming isolation, trench etches, and the like would all benefit from insitu monitoring as taught herein. Any machine or flow parameter accessible to a human user or a computer may be insitu altered by the process taught herein. Correlation data for a plurality of process variables and parameters may be collected and/or simultaneously stored/processed via the computer. It is to be understood, therefore, that this invention is not limited to the particular forms illustrated and that it is intended in the appended claims to cover all modifications that do not depart from the spirit and scope of this invention.

We claim:

1. A method for etching a layer of material in a semiconductor etch system, the method comprising the steps of:

exposing the layer of material to an etch environment, the layer of material having a top surface which is a non-planar top surface;

monitoring an etch rate of the layer of material by monitoring an atomic structure which comprises only oxygen in the etch environment; and altering said etch environment to maintain said etch rate at a selected etch rate which lies within a selected tolerance range in order to planarize the top surface of the layer of material to a surface which is more planar than the non-planar top surface.

2. The method of claim 1 wherein the step of altering said etch environment comprises altering at least one variable within a group consisting of: semiconductor etch system chamber pressure, semiconductor etch system chamber temperature, semiconductor etch system voltage potential, semiconductor etch system chamber energy, semiconductor etch system chamber dimensions, semiconductor etch system electrode separation, semiconductor etch system gas flow, semiconductor etch system chamber chemistry, and semiconductor etch system ambient gas concentrations.

3. The method of claim 1 wherein the step of altering said etch environment comprises:

altering the concentration of the atomic structure which comprises only oxygen within the semiconductor etch system.

4. The method of claim 1 wherein the step of altering said etch environment comprises:

altering the etch environment in N discrete steps, where N is an integer greater than zero.

5. The method of claim 1 wherein the step of altering said etch environment comprises:

altering the etch environment dynamically, based upon said etch rate.

6. The method of claim 5 wherein the semiconductor etch system has a controller and a chamber, and the step of altering said etch environment dynamically comprises:

alternating said etch environment in an insitu manner via a feedback path which is coupled between the chamber and the controller; and controlling the feedback path by a computer.

7. The method of claim 1 further comprising:

forming a masking layer comprising photoresist over the layer of material; and planarizing the layer of material by etching the masking layer and the layer of material at a substantially equal rate.

8. The method of claim 1 wherein the step of monitoring the etch rate comprises:

optically monitoring at least one optical wavelength of the atomic structure which comprises only oxygen in an etch chemistry environment located within the semiconductor etch system.

9. The method of claim 8 wherein the step of optically monitoring comprises:

monitoring a single optical frequency of the atomic structure which comprises only oxygen within a wavelength range of 200 nm to 800 nm.

10. The method of claim 1 wherein the semiconductor etch system etches a semiconductor wafer and the step of monitoring the etch rate comprises:

monitoring a surface of the semiconductor wafer with an energy source to determine the etch rate.

11. The method of claim 10 wherein the step of monitoring the surface of the semiconductor wafer comprises:

using an energy source selected from a group consisting of: a laser, a collimated light source, and a polarized light source.

12. The method of claim 10 wherein a masking layer is formed overlying the layer of material and the layer of material is formed overlying a semiconductor wafer, the step of monitoring the surface of the semiconductor wafer comprises:

using a first energy source to monitor an etch rate of the layer of material; and using a second energy source to monitor an etch rate of the masking layer.

13. The method of claim 12 wherein the step of monitoring the surface of the semiconductor wafer comprises:

altering said etch environment to maintain a substantially equal etch rate for both the layer of material and the masking layer.

14. The method of claim 1 wherein the step of monitoring comprises:

monitoring an etch plasma for a change in atomic O concentration.

15. A method for etching a layer of material overlying a semiconductor wafer substrate, the semiconductor wafer substrate being physically supported by a semiconductor equipment system, the method comprising the steps of:

exposing the layer of material to an etch chemistry having a chemical composition which includes an oxygen concentration wherein the oxygen concentration includes atomic structures which contain only oxygen atoms;

monitoring the etch chemistry via an optical detector to determine variations in the chemical composition of the etch chemistry, the variations being detected by monitoring an oxygen emission line corresponding to the atomic structures which contain only oxygen atoms; and altering the chemical composition of the etch chemistry to maintain the chemical composition within a selected range wherein an etch rate of the layer of material is substantially constant over time.

16. The method of claim 15 wherein the step of altering said chemical composition comprises:

altering the concentration of the atomic structure which contain only oxygen atoms within the semiconductor equipment system.

17. The method of claim 15 wherein the step of altering said chemical composition comprises:
   altering the chemical composition by one of either increasing or decreasing a gas flow of a chemical species within the chemical composition in N discrete steps over time, where N is an integer greater than zero.

18. The method of claim 15 wherein the step of altering said chemical composition comprises:
   altering the chemical composition dynamically via a computer, the altering being based upon measured deviations in said etch rate.

19. The method of claim 15 wherein the semiconductor etch system has a controller and a chamber, and the step of altering said chemical composition comprises:
   alternating said etch environment in an insitu manner via a feedback path which is coupled between the chamber and the controller; and
   controlling the feedback path by a computer.

20. The method of claim 15 further comprising:
   forming a masking layer over the layer of material; and
   planarizing the layer of material by etching the masking layer and the layer of material at a substantially equal rate.

21. The method of claim 15 wherein the step of monitoring the etch chemistry comprises:
   optically monitoring at least one optical wavelength of the atomic structures which contain only oxygen atoms within an etch chemistry environment which is located within the semiconductor etch system.

22. The method of claim 15 wherein the step of monitoring the etch chemistry comprises:
   monitoring an etch plasma for a change in concentration of the atomic structures which contain only oxygen atoms.

23. A method for etching both a first layer of material overlying a semiconductor wafer substrate and a second layer of material overlying the semiconductor wafer substrate, the first layer of material being different from the second layer of material, the semiconductor wafer being physically supported by a semiconductor equipment system, the method comprising the steps of:
   exposing both the first layer of material and the second layer of material to an etch chemistry having a chemical composition, the etch chemistry resulting in a first selected etch rate for the first layer of material and a second selected etch rate for the second layer of material, the first layer of material having an initial non-planar top surface;
   monitoring the surface of the first layer of material via a first energy source to determine variations in the first selected etch rate;
   monitoring the surface of the second layer of material via a second energy source to determine variations in the second selected etch rate; and
   altering the etch chemistry to maintain the chemical composition within a selected range wherein an etch rate of the first layer of material is substantially equal to the etch rate of the second layer of material over a predetermined period of time so that the of material is planarized to have a more planar top surface than the initial non-planar top surface.

24. The method of claim 23 further comprising the steps of:
   forming a masking layer of photoresist over the layer of material; and
   planarizing the layer of material by etching the masking layer and the layer of material at a substantially equal rate.

25. The method of claim 23 wherein the step of monitoring the layer of material comprises:
   using an energy source selected from a group consisting of: a laser, a collimated light source, and a polarized light source.

26. The method of claim 23 wherein a masking layer is formed overlying the layer of material and the step of monitoring the layer of material comprises:
   using a first energy source to monitor an etch rate of the layer of material; and
   using a second energy source to monitor an etch rate of the masking layer.

27. The method of claim 26 wherein the step of monitoring the surface of the semiconductor wafer comprises:
   altering said etch environment to maintain a substantially equal etch rate for both the layer of material and the masking layer, the altering resulting in a change in atomic O concentration in the etch environment.

28. A method for monitoring a semiconductor etch system environment within a semiconductor etch system, the method comprising the steps of:
   placing at least one semiconductor wafer within the semiconductor system, the semiconductor wafer having a layer of material which has a non-planar top surface;
   etching the semiconductor wafer in the semiconductor system environment wherein the semiconductor equipment environment contains at least one chemical etch species;
   monitoring the semiconductor equipment environment over time with an optical measurement device, the optical measurement device detecting changes in the semiconductor equipment environment over time which affect the processing of the semiconductor wafer by monitoring an emission line which corresponds to an atomic structure containing only oxygen atoms, the atomic structure being present in the semiconductor equipment environment; and
   dynamically altering the semiconductor system environment to minimize changes over time which affect the etching of the semiconductor wafer wherein the non-planar top surface is further planarized by the steps of dynamically altering.

29. The method of claim 28 wherein the step of monitoring comprises:
   monitoring the semiconductor equipment environment over time with an optical sensor tuned to a frequency substantially equal to 437 nm.

30. A method for etching a layer of material having a nonplanar surface to form a planar surface from the nonplanar surface, the method comprising the steps of:
   providing a substrate;
   forming the nonplanar layer of material overlying the substrate;
   forming a planar layer of material overlying the nonplanar layer of material; and
   etching the planar layer of material at a first etch rate and etching the nonplanar layer of material at a second etch rate to form said planar surface on the layer of material, the first etch rate and the second etch rate being kept substantially equal by monitoring the first etch rate and the second etch rate and controlling an etch environment during the step of etching, the monitoring being performed by a method selected from a group consisting of: (1) monitoring an emission line of an atomic structure containing only oxygen atom(s) in an etch environment and (2) monitoring the surface of the planar layer of material with a first light source, a first beamsplitter, and a first photodetector and monitoring the nonplanar layer of material with a second light source, a second beamsplitter, and a second photodetector.

31. The method of claim 30 wherein the step of etching comprises:

monitoring the semiconductor equipment environment over time with a detection device selected from a group consisting of: a laser, a collimated light source, a polarized light source, a monochrometer, an interferometer, a mass spectrometer, a spectrum analyzer, and an optical sensor.

32. A method for etching a plurality of wafers, the method comprising the steps of:

placing at least one wafer into a batch semiconductor equipment chamber, the at least one wafer having a non-planar layer made of a first material and a planar layer made of a second material and overlying the non-planar layer, the planar layer being more planar than the non-planar layer, the first material being different from the second material;

placing a monitoring wafer into the batch semiconductor equipment chamber, the monitoring wafer having a first portion which exposes an area of first material and a second portion which exposes an area of second material;

exposing the at least one wafer and the monitoring wafer to an etch environment; and monitoring the etch rate of the first and second portion of the monitoring wafer to ensure that an etch rate of the first material of the at least one wafer and an etch rate of the second material of the at least one wafer are substantially equal so that the at least one wafer is etched in a manner which increases the planarization of the non-planar layer.

* * * * *